United States Patent
Abramzon et al.

(10) Patent No.: US 10,411,593 B1
(45) Date of Patent: Sep. 10, 2019

(54) AVERAGE AND DECIMATE OPERATIONS FOR BANG-BANG PHASE DETECTORS

(71) Applicant: Samsung Display Co., Ltd., Yongin-si, Gyeonggi-do (KR)

(72) Inventors: Valentin Abramzon, Mountain View, CA (US); Amir Amirkhany, Sunnyvale, CA (US); Anup P. Jose, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/109,645

(22) Filed: Aug. 22, 2018

Related U.S. Application Data

(60) Provisional application No. 62/641,911, filed on Mar. 12, 2018.

(51) Int. Cl.
*H03L 7/089* (2006.01)
*H02M 3/07* (2006.01)
*H03K 21/08* (2006.01)

(52) U.S. Cl.
CPC .............. *H02M 3/07* (2013.01); *H03K 21/08* (2013.01)

(58) Field of Classification Search
CPC .................... H02M 3/07; H03K 21/08
USPC ......... 327/306–333, 147–163; 375/373–376; 331/1 A, 1 R
See application file for complete search history.

(56) References Cited

U.S. PATENT DOCUMENTS

| | | | |
|---|---|---|---|
| 6,580,376 B2 | 6/2003 | Perrott | |
| 7,916,780 B2 | 3/2011 | Lee | |
| 8,798,217 B2 | 8/2014 | Kong et al. | |
| 9,014,322 B2 | 4/2015 | Nguyen et al. | |
| 9,509,319 B1 | 11/2016 | Chattopadhyay et al. | |
| 9,716,582 B2 | 7/2017 | Ramezani et al. | |
| 2010/0295586 A1* | 11/2010 | Weiner | H03L 7/087 327/157 |

* cited by examiner

*Primary Examiner* — Tomi Skibinski
(74) *Attorney, Agent, or Firm* — Lewis Roca Rothgerber Christie LLP

(57) ABSTRACT

A system and method for a decimated phase detector circuit includes a bang bang phase detector (BBFD), an UP rolling counter connected to an UP output of the BBFD, and a DOWN rolling counter connected to a DOWN output of the BBFD. A charge pump is connected to the UP rolling counter and the DOWN rolling counter and is configured to receive a decimated UP signal from the UP rolling counter and a decimated DOWN signal from the DOWN rolling counter. The charge pump is further configured to provide a control voltage according to the received decimated UP signals and decimated DOWN signals.

19 Claims, 8 Drawing Sheets

AVERAGE AND DECIMATE OPERATIONS FOR BANG-BANG PHASE DETECTORS

CROSS-REFERENCE TO RELATED APPLICATION

The present application claims priority to, and the benefit of, U.S. Provisional Patent Application No. 62/641,911, filed on Mar. 12, 2018, the contents of which are incorporated herein by reference in its entirety.

BACKGROUND

Some embodiments of the present disclosure relate generally to bang-bang phase detectors in analog clock data recovery (CDR).

Serial links include a transmitter connected to a receiver via a channel. The receiver generally includes a circuit configured to generate a clock that aligns with the phase of the incoming data.

FIG. 1 depicts a related art CDR circuit configured to align a locally generated clock with an incoming data signal.

Referring to FIG. 1, a related art CDR system 100 includes data and crossing slicers 110 that sample the incoming data and provide the data to the bang-bang phase detector 120. The bang-bang phase detector 120 determines if the phase of the clock generated by a voltage controlled oscillator (VCO) 130 is in alignment (e.g., in phase) with the incoming data. A bang-bang phase detector has 3 states that include the phase being early, late, or that there is no useful information (e.g., there is no data transition required to determine phase alignment). Based on the current state, the bang-bang phase detector 120 outputs an up value or a down value. The up and down signals are provided to a charge pump 140 which activates a switch to increase or decrease the control voltage of the VCO 130. For example, when an up signal is received at the charge pump 140, the charge pump increases the control voltage of the VCO 130 and the speed of the clock generated is increased. Similarly, when a down signal is received at the charge pump 140, the charge pump 140 decreases the control voltage of the VCO 130 and the speed of the clock generated is decreased.

CDRs that use bang-bang phase detectors with charge pumps suffer from a number of problems. For example, the loop needs to have a low bandwidth to filter jitter due to inter-symbol interference (ISI), which requires either a large charge pump capacitor (C) or a small charge pump current (Icp), which causes the charge pump to be sensitive to mismatch, charge injection, and other non-idealities. Additionally, it may be difficult to operate a charge pump at a high frequency, especially with a small charge pump current (Icp) (e.g., the charge injection may overwhelm the Icp).

Thus, a method of decimating the number of ups and downs from the bang-bang phase detector is needed. Related art methods of decimating the output of a bang-bang phase detector often discard information. For example, some systems decimate the bang-bang phase detector by a factor N (e.g., every Nth output is provided). Some systems decimate by adding all the ups and subtracting all the downs for a period of time and outputting the sign of the result. This summing method, however, discards how many more ups than downs or downs than ups occurred. Thus, an improved system and method that requires less power, space, and maintains the fidelity of the number of ups and downs output by the bang-bang phase detector is desired.

The above information is only for enhancement of understanding of the background of embodiments of the present disclosure, and therefore may contain information that does not form the prior art.

SUMMARY

Some embodiments of the present disclosure provide a system and method for a decimated phase detector circuit. The decimated phase detector circuit may include a bang bang phase detector (BBFD), an UP rolling counter connected to an UP output of the BBFD, and a DOWN rolling counter connected to a DOWN output of the BBFD. The decimated phase detector circuit also includes a charge pump connected to the UP rolling counter and the DOWN rolling counter and is configured to receive a decimated UP signal from the UP rolling counter and a decimated DOWN signal from the DOWN rolling counter, wherein the charge pump is further configured to provide a control voltage according to the received decimated UP signals and decimated DOWN signals.

In various embodiments, the UP rolling counter is configured to incrementing an UP state each time an UP is provided by the UP output of the BBFD and the DOWN rolling counter is configured to incrementing a DOWN state each time a DOWN is provided by the DOWN output of the BBFD.

In various embodiments, the UP rolling counter is configured to output the decimated UP signal each time the UP state of the UP rolling counter rolls over to zero; and the DOWN rolling counter is configured to output the decimated DOWN signal each time the DOWN state of the DOWN rolling counter rolls over to zero.

In various embodiments, the UP rolling counter includes an UP ripple counter connected to the UP output of the BBFD and an UP falling edge detector connected to an output of the UP ripple counter. In various embodiments, the UP falling edge detector is configured to output the decimated UP signal when the UP ripple counter rolls over.

In various embodiments, the DOWN rolling counter includes a DOWN ripple counter connected to the DOWN output of the BBFD and a DOWN falling edge detector connected to an output of the ripple counter. In various embodiments, the DOWN falling edge detector is configured to output the decimated DOWN signal when the DOWN ripple counter rolls over.

In various embodiments, the BBFD comprises a dual data rate BBFD and the UP and DOWN ripple counters comprise a dual data rate interface.

In various embodiments, the charge pump is an integrator configured to store a value representative of a total of decimated UP signals minus a total of decimated DOWN signals.

In various embodiments, the UP rolling counter is an UP N-bit rolling counter configured to output the decimated UP signal after every 2Nth UP signal received from the BBPD and the DOWN rolling counter is a DOWN N-bit rolling counter configured to output the decimated DOWN signal after every 2Nth DOWN signal received from the BBPD.

In various embodiments, the UP N-bit rolling counter is an UP 2-bit rolling counter configured to output the decimated UP signal after every fourth UP signal received from the BBPD.

In various embodiments, the DOWN N-bit rolling counter is a DOWN 2-bit rolling counter configured to output the decimated DOWN signal after every fourth DOWN signal received from the BBPD.

In various embodiments, the decimated phase detector circuit further includes a voltage controlled oscillator configured to generate a clock according to the control voltage.

In various embodiments, a method of decimating a bang bang phase detector includes receiving, at an UP rolling counter, UP signals from the bang bang phase detector (BBFD) and incrementing an UP state for each received UP signal; receiving, at a DOWN rolling counter, down signals from the BBFD, and incrementing a DOWN state for each received DOWN signal; providing, by the UP rolling counter, a decimated UP signal each time the UP state of the UP rolling counter rolls over to zero; and providing, by the DOWN rolling counter, a decimated DOWN signal each time the DOWN state of the DOWN rolling counter rolls over to zero.

In various embodiments, the method further includes integrating, at a charge pump, a total of decimated UP signals minus a total of decimated DOWN signals.

In various embodiments, the method further includes providing, by the charge pump, a control voltage according to the total of decimated UP signals minus the total of decimated DOWN signals.

In various embodiments, the control voltage is provided to a voltage controlled oscillator.

In various embodiments, the UP rolling counter includes an UP ripple counter connected to an UP output of the BBFD and an UP falling edge detector connected to an output of the UP ripple counter.

In various embodiments, the UP falling edge detector is configured to output the decimated UP signal when the UP ripple counter rolls over to zero.

In various embodiments, the DOWN rolling counter includes a DOWN ripple counter connected to a DOWN output of the BBFD and a DOWN falling edge detector connected to an output of the ripple counter.

In various embodiments, the DOWN falling edge detector is configured to output the decimated DOWN signal when the DOWN ripple counter rolls over to zero.

In various embodiments, the UP rolling counter is an UP N-bit rolling counter configured to output the decimated UP signal after every $2^N$th UP signal received from the BBPD.

In various embodiments, the DOWN rolling counter includes a DOWN N-bit rolling counter configured to output the decimated DOWN signal after every $2^N$th DOWN signal received from the BBPD.

In various embodiments, a method of decimating a bang bang phase detector includes: incrementing, at an UP rolling counter, an UP state based on a received UP signal from the bang bang phase detector (BBFD); incrementing, at a DOWN rolling counter, a DOWN state based on a received down signal from the BBFD; providing, by the UP rolling counter, a decimated UP signal to a charge pump, each time the UP state of the UP rolling counter rolls over to zero; providing, by the DOWN rolling counter, a decimated DOWN signal to the charge pump, each time the DOWN state of the DOWN rolling counter rolls over to zero; and integrating, at the charge pump, a total of decimated UP signals minus a total of decimated DOWN signals.

In various embodiments, the the UP rolling counter is an UP ripple counter connected to an UP output of the BBFD and an UP falling edge detector connected to an output of the UP ripple counter. In various embodiments, the UP falling edge detector is configured to output the decimated UP signal when the UP state of the UP ripple counter rolls over.

In various embodiments, the DOWN rolling counter includes a DOWN ripple counter connected to a DOWN output of the BBFD and a DOWN falling edge detector connected to an output of the ripple counter. In various embodiments, the DOWN falling edge detector is configured to output the decimated DOWN signal when the DOWN state of the DOWN ripple counter rolls over.

In various embodiments, the method further includes providing, by the charge pump, a control voltage according to the total of decimated UP signals minus the total of decimated DOWN signals.

In various embodiments, the UP rolling counter includes an UP N-bit rolling counter configured to output the decimated UP signal after every 2Nth UP signal received from the BBPD.

In various embodiments, the DOWN rolling counter includes a DOWN N-bit rolling counter configured to output the decimated DOWN signal after every 2Nth DOWN signal received from the BBPD.

BRIEF DESCRIPTION OF THE DRAWINGS

Some embodiments can be understood in more detail from the following description taken in conjunction with the accompanying drawings, in which.

DETAILED DESCRIPTION

Figure 1:
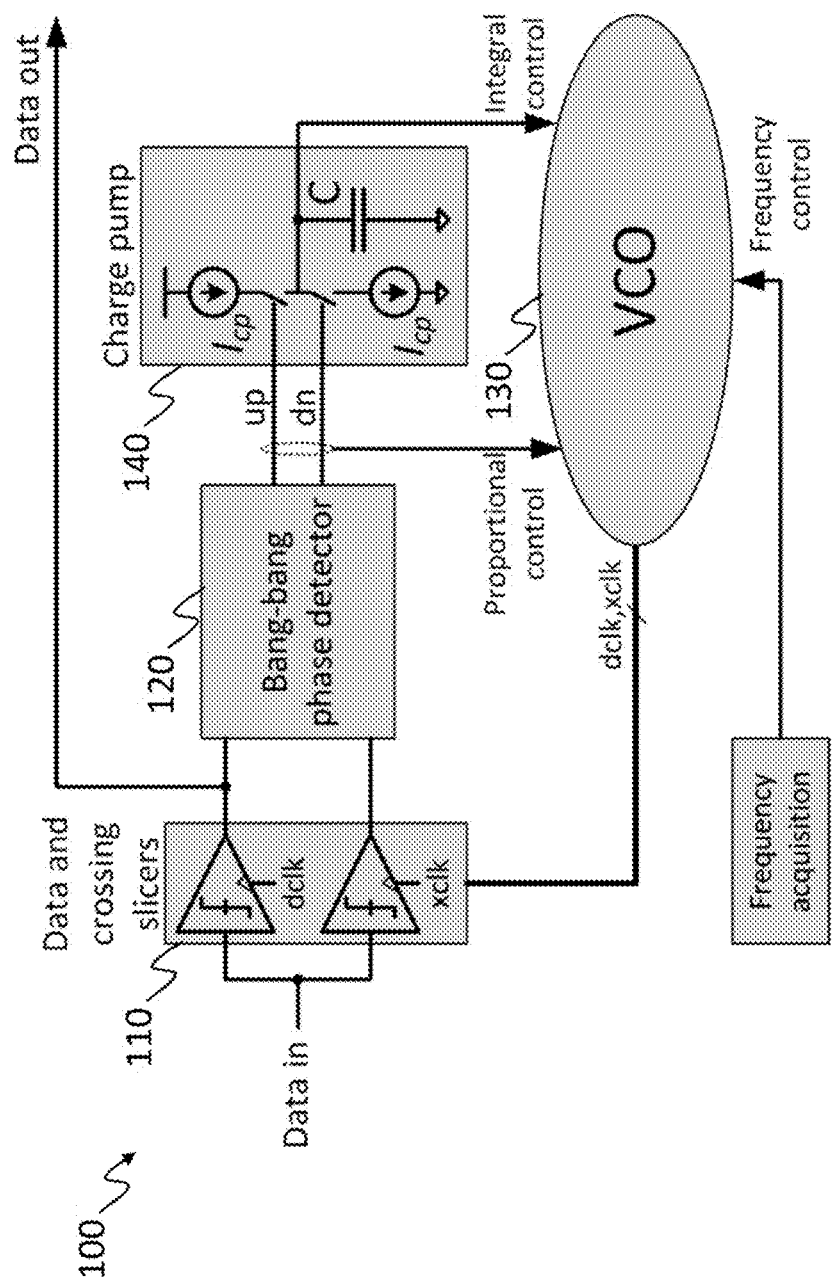
FIG. 1 depicts a related art CDR.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

Embodiments of the present disclosure include a system and method for decimating the output of a bang-bang phase detector (BBPD). In various embodiments, the system and method allows for the decimation of the BBPD output while still integrating the decimated up and down signals so that there is no error accumulation while using a standard charge pump (i.e., without the need for a multi-bit DAC to drive the charge pump). In various embodiments, a first rolling counter is used to count the number of up pulses generated by the BBPD and a second rolling counter is used to count the number of down pulses generated by the BBPD. Once either rolling counter reaches its maximum value, the rolling counter provides a decimated output to the charge pump, rolls over to the initial zero count, and continues counting from zero.

Figure 2A:
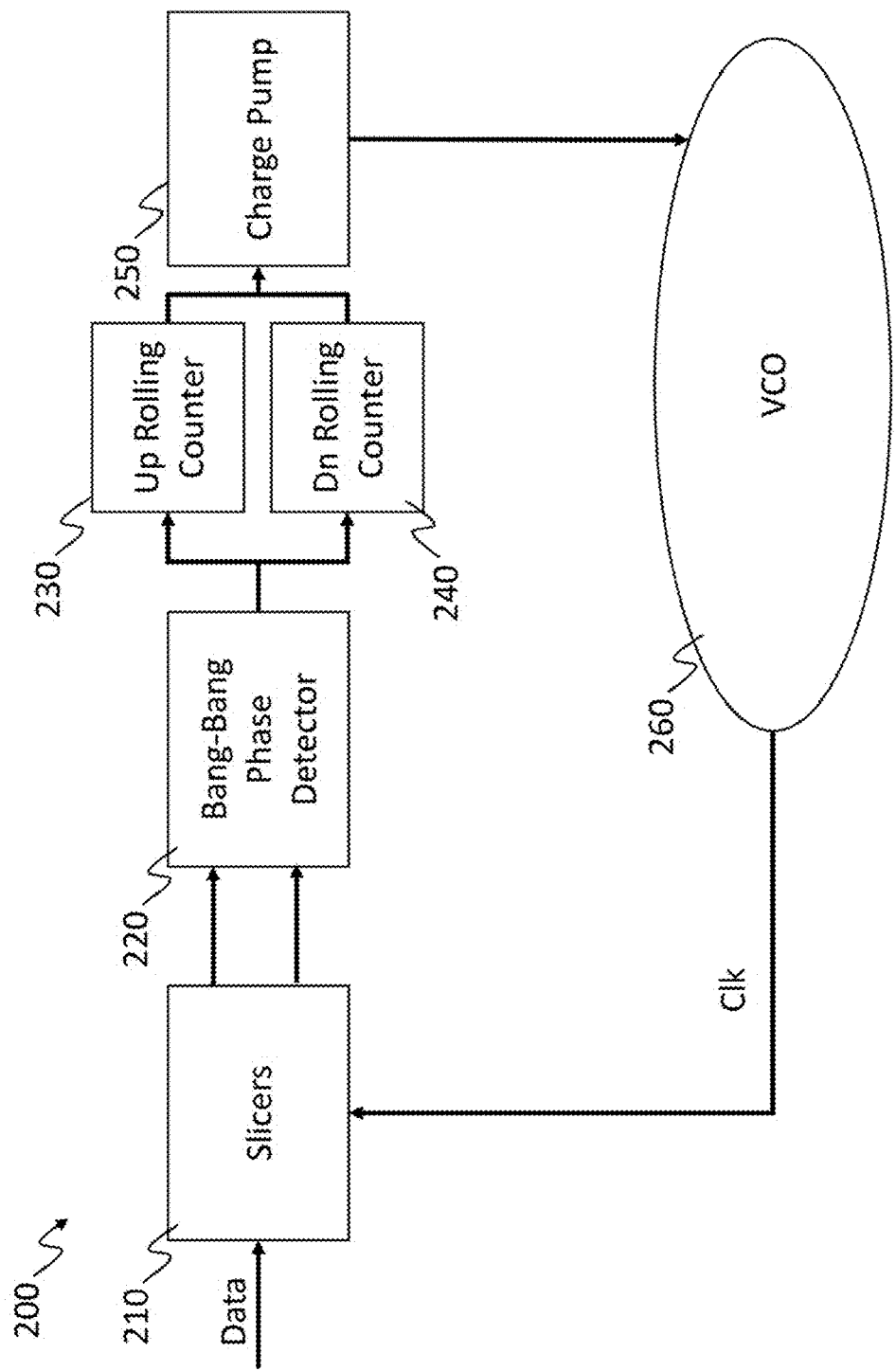
FIG. 2A depicts a CDR with a decimated BBPD circuit according to various embodiments of the present disclosure.
Figure 2B:
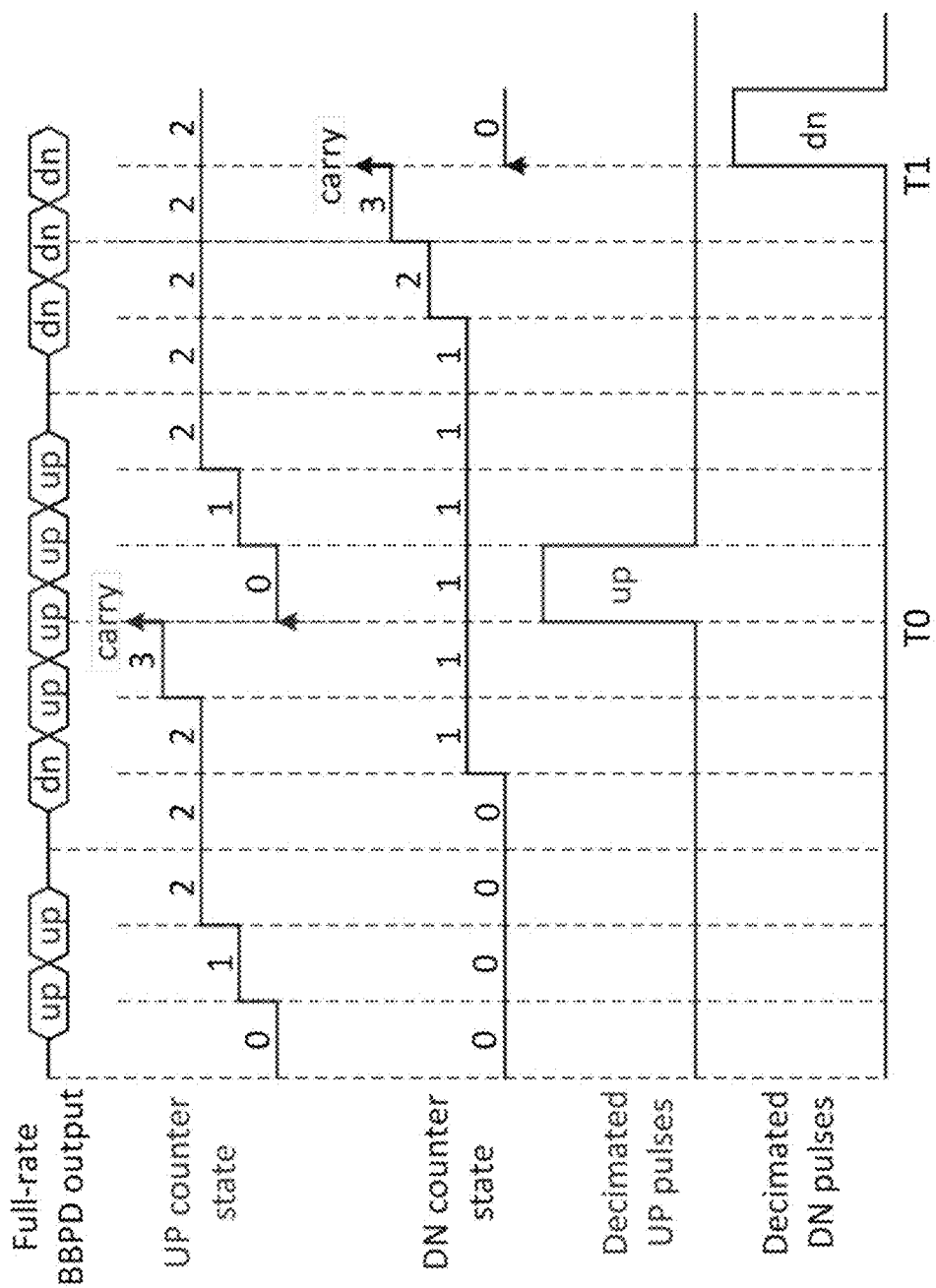
FIG. 2B depicts a timing diagram of the operation rolling counters of FIG. 2A according to various embodiments of the present disclosure.
Figure 2C:
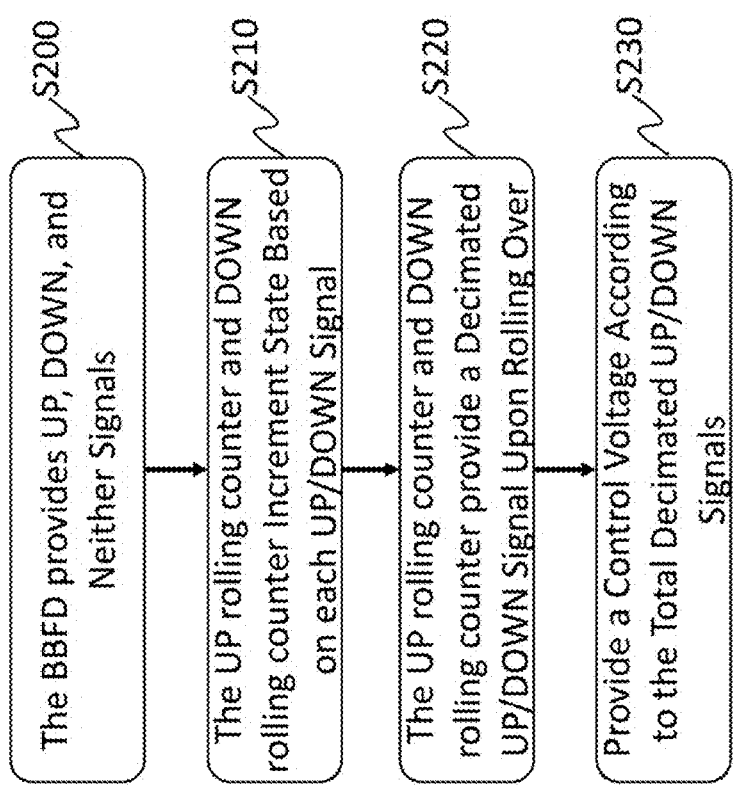
FIG. 2C depicts a flow chart of the operation of the decimated BBPD according to various embodiments of the present disclosure.

FIG. 2A depicts a CDR with a decimated BBPD circuit according to various embodiments of the present disclosure. FIG. 2B depicts a timing diagram of the operation of rolling counters of FIG. 2A according to various embodiments of the present disclosure. FIG. 2C depicts a flow chart of the operation of the decimated BBPD according to various embodiments of the present disclosure.

Referring to FIGS. 2A-C, in various embodiments a CDR 200 includes a decimated phase detector circuit with rolling counters to provide accurate decimation. In various embodiments, the CDR 200 includes a slicer 210 for receiving incoming data, a BBPD 220 for comparing the phase of the incoming data with the current clock (CLK), an UP rolling counter 230 for counting each UP output of the BBPD 220, a DOWN rolling counter 240 for counting each DOWN output of the BBPD 220, a charge pump 250 for maintaining and modifying the control voltage for the VCO 260 to generate the clock (CLK). In various embodiments, the charge pump 250 includes an integrator (e.g., a capacitor-based circuit for maintaining a voltage for controlling the VCO 260).

In various embodiments, the slicers 210 receive data from a transmitter and the BBFD 220 outputs UP signals, DOWN signals, and no output signals based on the slicer output (e.g. based on the phase alignment of the clock produced by the VCO 260). In various embodiments, the UP rolling counter 230 and DOWN rolling counter 240 are each N-bit (e.g., 2-bit) counters configured to drive the charge pump 250. Using an N-bit counter allows for the decimation of the output of the BBPD 220 by $2^N$ (e.g., by 4 for a 2-bit counter). For example, referring to FIG. 2B, a timing diagram showing an example BBPD output and the corresponding states of the up rolling counter 230, down rolling counter 240, and charge pump integrator when using 2-bit rolling counters. In various embodiments, the BBPD 220 may output an UP when the VCO 260 should increase the clock speed, output a DOWN when the VCO 260 should decrease the clock speed, and output neither (e.g., no output) when a decision cannot be made (S200). In various embodiments, the UP rolling counter 230 and the DOWN rolling counter are configured to increment their state according to the number of UP and DOWN signals output by the BBFD (S210). For example, Each UP output by the BBPD 220 results in the UP rolling counter 230 incrementing its state once. Similarly, each DOWN output by the BBPD 220 results in the DOWN rolling counter 240 incrementing its state once. Since the UP rolling counter 230 and the DOWN rolling counter are 2-bit counters, they can count up to 3 Ups/3 DOWNs before their state rolls over to a value of zero (e.g., on the 4th up, the state of the rolling counter rolls over to zero). Each time a rollover occurs, the UP rolling counter 230 and the DOWN rolling counter 240 provide a decimated UP/DOWN signal to the charge pump 250 (e.g., to the charge pump integrator) (S220). The charge pump 250 maintains a control voltage according to the number of UP/DOWN signals and provides the control voltage to the VCO 260 to modify the clock output of the VCO 260 (S230).

In this embodiment, because the UP and DOWN rolling counters 230, 240 are 2-bit counters, each decimated UP or DOWN output provided to the charge pump has a corresponding effect that is equivalent to four UP/DOWN outputs from a BBFD. For example, in a non-decimated BBPD, the charge pump would incrementally increase the control voltage at the charge pump integrator with each UP or DOWN by either applying a capacitor current Icp or removing a capacitor current Icp. Therefore, in various embodiments, Icp should be increased according to the decimation (e.g., a factor of 4 since the BBPD is being decimated by 4). In various other embodiments, Icp may be the same and the VCO 260 may have an increased sensitivity to account for the decimation (e.g., VCO 260 may be 4 times more sensitive to changes in the control voltage). Similarly, if a 3-bit counter was used instead of a 2-bit counter, the BBPD 220 would be decimated by 8 (e.g., there would need to be 8 UPs before the UP rolling counter 230 would roll over to 0) and decimated UP and DOWN signals are equivalent to 8 regular BBPD UP/DOWN signals.

As shown by FIG. 2B, after a fourth UP is output by the BBPD at T0, the UP rolling counter 230 rolls over to zero and the decimated UP pulse is provided. As the UP values are being accumulated, DOWN values are also being supplied by the BBPD and being accumulated in the DOWN rolling counter 240. Once a fourth DOWN is output by the BBPD 220 at T1, the DOWN rolling counter 240 rolls over to zero and a decimated DOWN pulse is provided.

Figure 3:
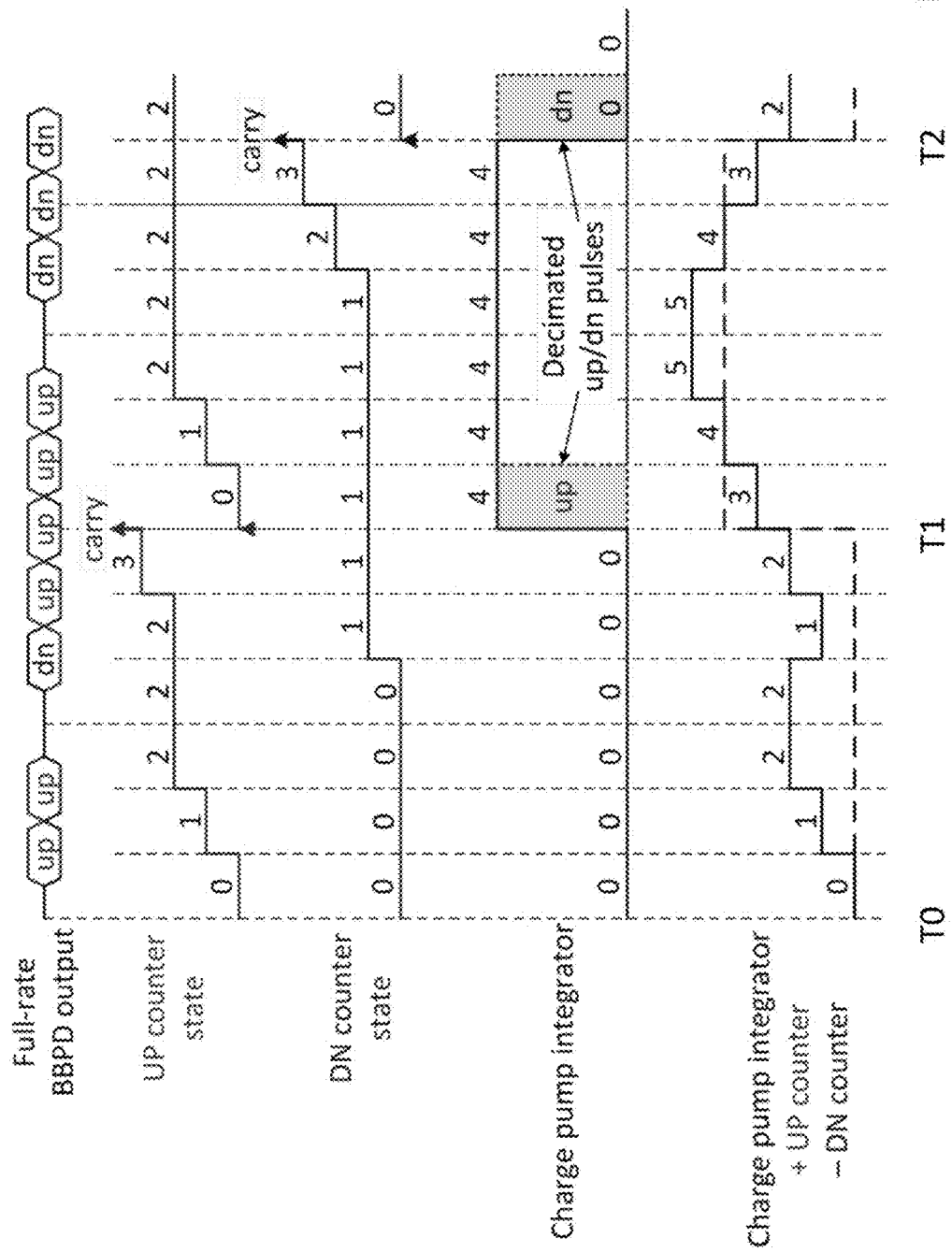
FIG. 3 depicts a timing diagram according to various embodiments of the present disclosure.

FIG. 3 depicts a timing diagram according to various embodiments of the present disclosure.

Referring to FIG. 3, in various embodiments, the system keeps track of the running sum of UPs and DOWNs provided by the BBPD. For example, as discussed above, the charge pump 250 includes an integrator. The charge pump integrator includes the coarse (e.g., decimated) UP/DOWN pulses while the UP rolling counter and the DOWN rolling counter include the fine UP/DOWN pulses. For example, at T0 the UP rolling counter, the DOWN rolling counter, and the charge pump are each initially 0. The first line of the timing diagram includes the full-rate output of the BBPD. The output includes two initial UP outputs, a zero output, a DOWN output, four UP outputs, a zero output, and three down outputs. Each of the UP and DOWN outputs is tracked by the UP rolling counter and the DOWN rolling counter. At T1 the BBPD outputs the fourth UP output and the UP rolling counter rolls over to 0 and a decimated up pulse is provided to the charge pump integrator which stores a value of 4. After T1, the BBPD continues to output UP, DOWN, and zero outputs until at T2, a fourth DOWN output is received. At T2, the DOWN rolling counter rolls over to zero and a decimated down pulse is provided to the charge pump integrator and the charge pump integrator's stored value is reduced back to zero. The bottom line of the timing diagram depicts how the system maintains a full accounting for every received up and down pulse between the UP and DOWN rolling counters and the charge pump integrator. For example, at T0 the cumulative value is at zero (e.g., the UP/DOWN rolling counters and the charge pump integrator are each at zero). At T1, the cumulative value is at 3 since the UP counter has rolled over to zero, the DOWN rolling counter is at 1, and the charge pump integrator is at 4 (e.g., 0−1+4=3). At T2, the cumulative value is at 2 since the UP rolling counter has a value of 2, and the DOWN rolling counter and the charge pump integrator are both at zero (e.g., 2−0+0). Thus, at any given time a running sum of the number of UP minus the number of DOWN signals is maintained.

Figure 4:
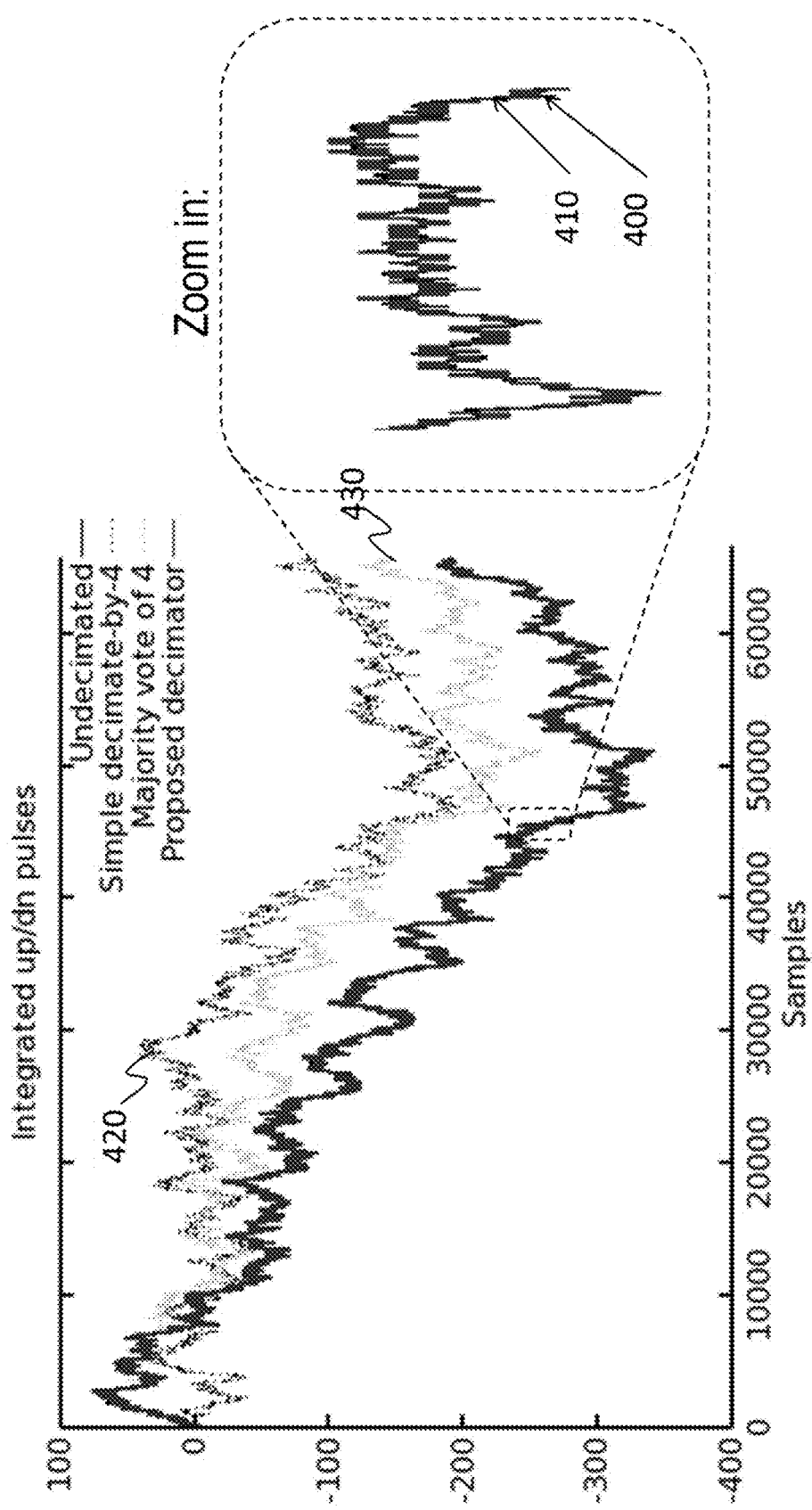
FIG. 4 depicts a simulated plot of the output of UP/DOWN signals of a BBPD, decimated using several decimation techniques and integrated by the charge pump.

FIG. 4 depicts a simulated plot of integrated UP/DOWN signals of a BBPD decimated using several decimation techniques.

Referring to FIG. 4, in various embodiments, the integrated UP/DOWN output of the BBPD is depicted. The plot includes an ideal undecimated plot 400. In various embodiments, the plot includes a proposed decimated system plot 410, a simple decimate by 4 plot 420, and a majority vote of 4 plot 430. As shown by FIG. 4, the proposed decimated system plot 410 closely tracks the ideal undecimated plot 400, while simple decimate by 4 and majority vote of 4 plots 420, 430 are not nearly as accurate.

Figure 5:
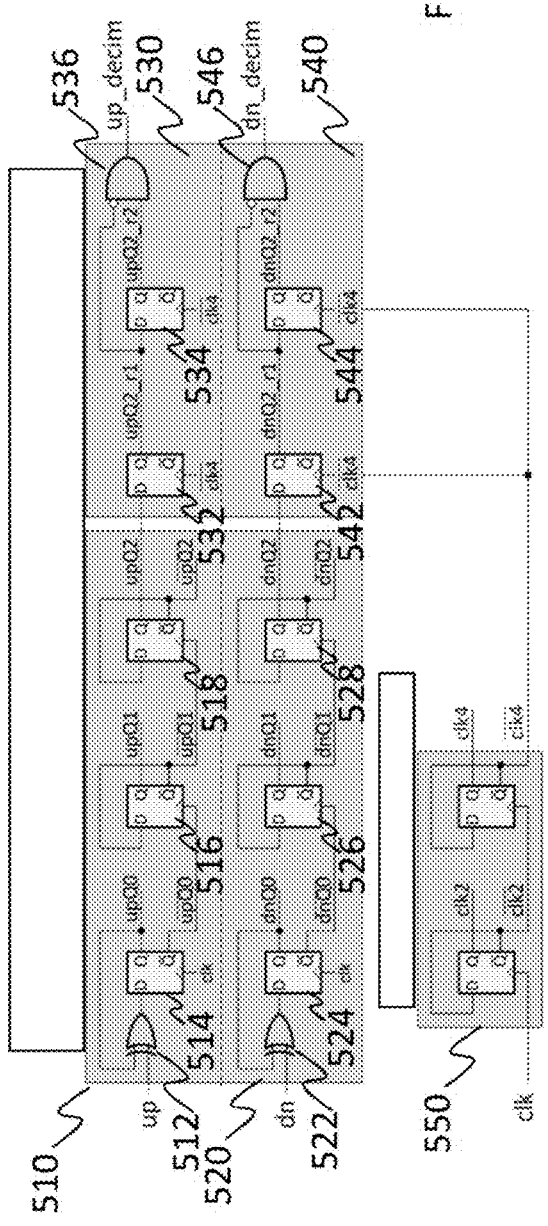
FIG. 5 depicts an embodiment of UP and DOWN rolling counters according to various embodiments.
Figure 5:
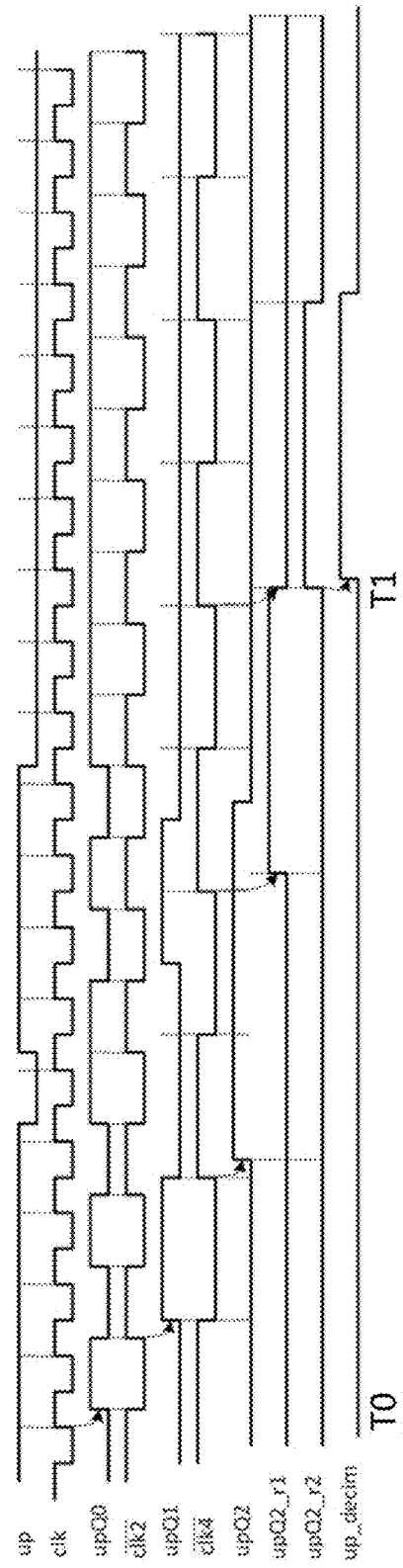

FIG. 5 depicts an embodiment of UP and DOWN rolling counters according to various embodiments.

Referring to FIG. 5, the UP and DOWN rolling counters 500 may be implemented using ripple counters. In various embodiments, the use of ripple counters may simplify the timing of the rolling counters and reduce the power consumed by the rolling counters. In the depicted embodiment, the system implements a decimate-by-8 operation, however, in various embodiments, the ripple counters may be implemented as N-bit ripple counters. FIG. 5 also includes a corresponding timing diagram showing the operation of the ripple counters with respect to UP signals from the BBPD. It should be understood that the system would operate similarly with respect with DOWN signals from the BBPD.

In various embodiments, the UP ripple counter 510 may include an exclusive OR gate 512 at an UP input and 3 flip-flops 514, 516, 518 (e.g, for counting up to 3 bits to decimate by 8). Similarly, the DOWN ripple counter 520 includes an exclusive OR gate 522 at a DOWN input and 3 flip-flops 524, 526, 528. The outputs of the UP and DOWN ripple counters 510, 520 are each connected to falling edge detectors 530, 540 which are configured to provide the decimated UP and DOWN signals when the ripple counters 510, 520 roll over to zero (e.g., after 8 UP or DOWN signals from the BBPD). In various embodiments, the falling edge detectors 530, 540 are provided with a decimated clock produced by a ripple counter clock 550. The ripple counter clock may be configured to output a clock based on the input clock that is operating a lower frequency. For example, as shown by the timing diagram, clk4 operates at one fourth the frequency of the input clock clk. The slower clock allows for the flip-flops in the falling edge detectors to not update their states as quickly.

In various embodiments, the UP falling edge detector 530 includes two flip-flops 532, 534 and an AND gate 536 with an inverter connected to the output of the first flip-flop 532 and a second output connected to the second flip flop 534. In various embodiments, the DOWN falling edge detector 540 also includes two flip-flops 542, 544 and an AND gate 546 with an inverter connected to the output of the first flip-flop 542 and a second output connected to the second flip flop 544. Falling edge detectors 530, 540 output a decimated UP or decimated DOWN signal each time the ripple counters roll over. For example, referring to the timing diagram at T0, the UP ripple counter 510 begins counting the UP signals (e.g., by incrementing its state) from the BBPD. After 8 UPs (e.g., at T1) have been received at the UP ripple counter 510, the UP falling edge detector 530 detects the ripple counter 530 rolling over and decimated UP signal is output.

Figure 6:
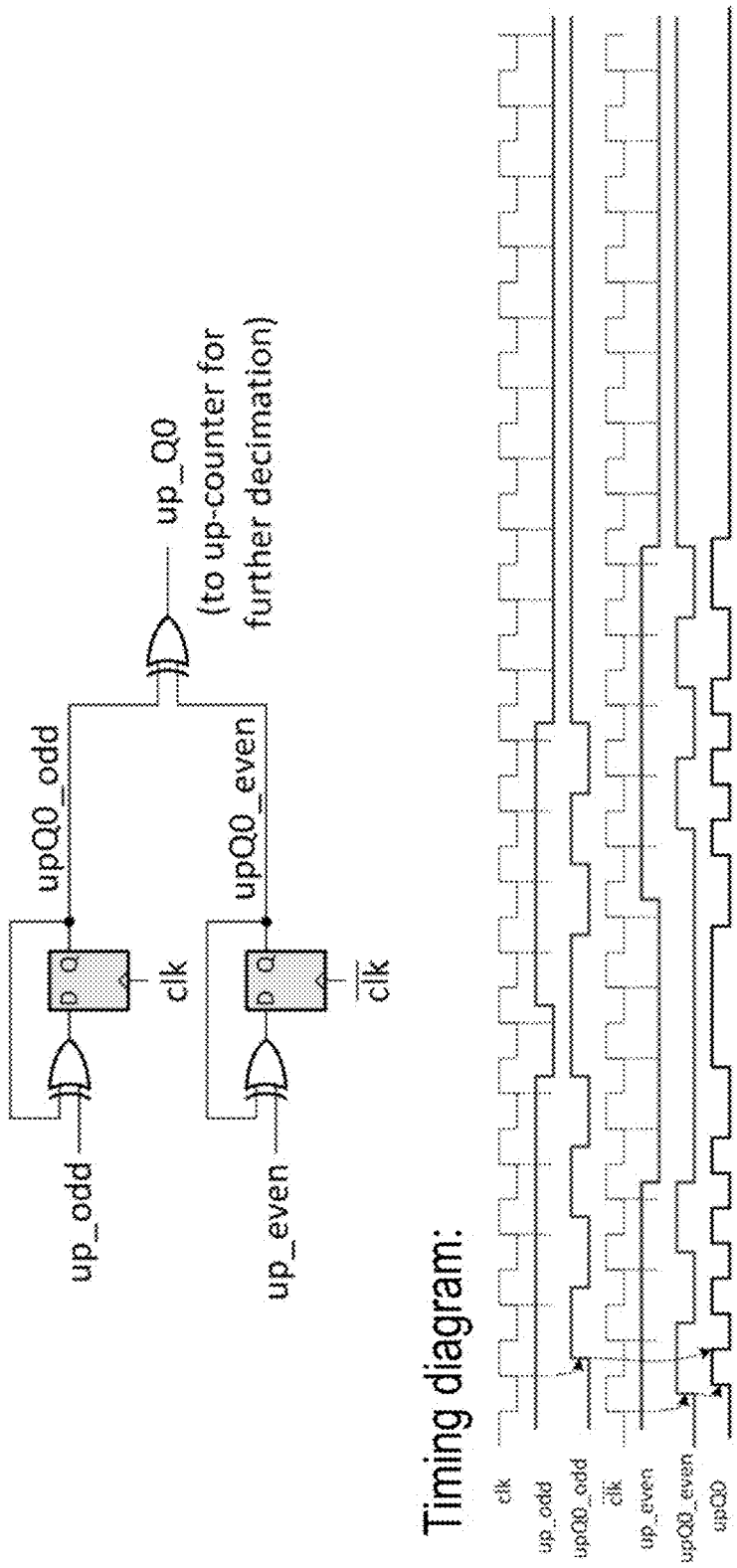
FIG. 6 depicts a dual data rate (DDR) interface in a first rolling counter stage according to various embodiments.

FIG. 6 depicts a dual data rate (DDR) interface in a first rolling counter stage according to various embodiments.

Referring to FIG. 6, in various embodiments, the UP and DOWN ripple counters may be modified to accept DDR UPs and DOWNs. For example, a DDR BBPD may include four outputs, UP_odd, UP_even, DOWN_odd, and DOWN_even. In various embodiments, the UP and DOWN ripple counters (e.g., the UP and DOWN ripple counters of FIG. 5) may be configured with UP_odd, UP_even, DOWN_odd, and DOWN_even inputs. For example, the first counting stage (e.g., exclusive OR gates 512, 522 and flip flops 514, 524) may be replaced by two first counting stages that each include an exclusive OR 610, 612, and a flip flop 620, 622 and operate on complementary clocks. The exclusive OR and flip flop operate in the same manner as above, and the output of each of the flip flops 620, 622 are provided to an exclusive OR 630 that merges the counting from both of the initial counting stages.

In the preceding description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A decimated phase detector circuit comprising:
    a bang bang phase detector (BBPD);
    an UP rolling counter connected to an UP output of the BBPD, wherein the UP rolling counter is configured to output a decimated UP signal each time an UP state of the UP rolling counter rolls over to zero;
    a DOWN rolling counter connected to a DOWN output of the BBPD wherein the DOWN rolling counter is configured to output a decimated DOWN signal each time a DOWN state of the DOWN rolling counter rolls over to zero; and
    a charge pump connected to the UP rolling counter and the DOWN rolling counter and is configured to receive the decimated UP signal from the UP rolling counter each time the UP rolling counter rolls over to zero and the decimated DOWN signal from the DOWN rolling counter each time the DOWN rolling counter rolls over to zero, wherein the charge pump is further configured to provide a control voltage according to the received decimated UP signals and decimated DOWN signals.

2. The decimated phase detector circuit of claim 1, wherein the UP rolling counter is configured to incrementing an UP state each time an UP is provided by the UP output of the BBPD and the DOWN rolling counter is configured to incrementing a DOWN state each time a DOWN is provided by the DOWN output of the BBPD.

3. The decimated phase detector circuit of claim 1, wherein:
    the UP rolling counter comprises:
        an UP ripple counter connected to the UP output of the BBPD; and
        an UP falling edge detector connected to an output of the UP ripple counter, wherein the UP falling edge detector is configured to output the decimated UP signal when the UP ripple counter rolls over; and the DOWN rolling counter comprises:
- a DOWN ripple counter connected to the DOWN output of the BBPD; and
- a DOWN falling edge detector connected to an output of the ripple counter, wherein the DOWN falling edge detector is configured to output the decimated DOWN signal when the DOWN ripple counter rolls over.

4. The decimated phase detector circuit of claim 3, wherein the BBPD comprises a dual data rate BBPD and the UP and DOWN ripple counters comprise a dual data rate interface.

5. The decimated phase detector circuit of claim 1, wherein the charge pump comprises an integrator configured to store a value representative of a total of decimated UP signals minus a total of decimated DOWN signals.

6. The decimated phase detector circuit of claim 1, wherein:
- the UP rolling counter comprises an UP N-bit rolling counter configured to output the decimated UP signal after every $2^N$th UP signal received from the BBPD; and
- the DOWN rolling counter comprises a DOWN N-bit rolling counter configured to output the decimated DOWN signal after every $2^N$th DOWN signal received from the BBPD.

7. The decimated phase detector circuit of claim 6, wherein:
- the UP N-bit rolling counter comprises an UP 2-bit rolling counter configured to output the decimated UP signal after every fourth UP signal received from the BBPD; and
- the DOWN N-bit rolling counter comprises a DOWN 2-bit rolling counter configured to output the decimated DOWN signal after every fourth DOWN signal received from the BBPD.

8. The decimated phase detector circuit of claim 1, further comprising a voltage controlled oscillator configured to generate a clock according to the control voltage.

9. A method of decimating a bang bang phase detector comprising:
- receiving, at an UP rolling counter, UP signals from the bang bang phase detector (BBPD) and incrementing an UP state for each received UP signal;
- receiving, at a DOWN rolling counter, down signals from the BBPD and incrementing a DOWN state for each received DOWN signal;
- providing to a charge pump, by the UP rolling counter, a decimated UP signal each time the UP state of the UP rolling counter rolls over to zero; and
- providing to the charge pump, by the DOWN rolling counter, a decimated DOWN signal each time the DOWN state of the DOWN rolling counter rolls over to zero.

10. The method of decimating a BBPD of claim 9, further comprising integrating, at the charge pump, a total of decimated UP signals minus a total of decimated DOWN signals.

11. The method of decimating a BBPD of claim 10, further comprising providing, by the charge pump, a control voltage according to the total of decimated UP signals minus the total of decimated DOWN signals.

12. The method of decimating a BBPD of claim 11, wherein the control voltage is provided to a voltage controlled oscillator.

13. The method of decimating a BBPD of claim 9, wherein:
- the UP rolling counter comprises:
  - an UP ripple counter connected to an UP output of the BBPD; and
  - an UP falling edge detector connected to an output of the UP ripple counter, wherein the UP falling edge detector is configured to output the decimated UP signal when the UP ripple counter rolls over to zero; and
- the DOWN rolling counter comprises:
  - a DOWN ripple counter connected to a DOWN output of the BBPD; and
  - a DOWN falling edge detector connected to an output of the ripple counter, wherein the DOWN falling edge detector is configured to output the decimated DOWN signal when the DOWN ripple counter rolls over to zero.

14. The method of decimating a BBPD of claim 9, wherein:
- the UP rolling counter comprises an UP N-bit rolling counter configured to output the decimated UP signal after every $2^N$th UP signal received from the BBPD; and
- the DOWN rolling counter comprises a DOWN N-bit rolling counter configured to output the decimated DOWN signal after every $2^N$th DOWN signal received from the BBPD.

15. A method of decimating a bang bang phase detector comprising:
- incrementing, at an UP rolling counter, an UP state based on a received UP signal from the bang bang phase detector (BBPD);
- incrementing, at a DOWN rolling counter, a DOWN state based on a received down signal from the BBPD;
- providing, by the UP rolling counter, a decimated UP signal to a charge pump, each time the UP state of the UP rolling counter rolls over to zero;
- providing, by the DOWN rolling counter, a decimated DOWN signal to the charge pump, each time the DOWN state of the DOWN rolling counter rolls over to zero; and
- integrating, at the charge pump, a total of decimated UP signals minus a total of decimated DOWN signals.

16. The method of decimating a BBPD of claim 15, wherein the UP rolling counter comprises:
- an UP ripple counter connected to an UP output of the BBPD; and
- an UP falling edge detector connected to an output of the UP ripple counter, wherein the UP falling edge detector is configured to output the decimated UP signal when the UP state of the UP ripple counter rolls over.

17. The method of decimating a BBPD of claim 16, wherein the DOWN rolling counter comprises:
- a DOWN ripple counter connected to a DOWN output of the BBPD; and
- a DOWN falling edge detector connected to an output of the ripple counter, wherein the DOWN falling edge detector is configured to output the decimated DOWN signal when the DOWN state of the DOWN ripple counter rolls over.

18. The method of decimating a BBPD of claim 15, further comprising providing, by the charge pump, a control voltage according to the total of decimated UP signals minus the total of decimated DOWN signals.

19. The method of decimating a BBPD of claim 15, wherein:

the UP rolling counter comprises an UP N-bit rolling counter configured to output the decimated UP signal after every $2^N$th UP signal received from the BBPD; and the DOWN rolling counter comprises a DOWN N-bit rolling counter configured to output the decimated DOWN signal after every $2^N$th DOWN signal received from the BBPD.

* * * * *